…

United States Patent [19]

Wells

[11] Patent Number: 5,311,462
[45] Date of Patent: May 10, 1994

[54] PHYSICAL PLACEMENT OF CONTENT ADDRESSABLE MEMORIES

[75] Inventor: Steven Wells, Citrus Heights, Calif.

[73] Assignee: Intel Corporation, Santa Clara, Calif.

[21] Appl. No.: 811,464

[22] Filed: Dec. 19, 1991

[51] Int. Cl.⁵ .............................................. G11C 15/00
[52] U.S. Cl. ........................................ 365/49; 365/53; 257/544
[58] Field of Search ....................... 365/49, 51, 52, 53; 257/372, 391, 392, 393, 394, 401, 544, 484, 630, 652

[56] References Cited

U.S. PATENT DOCUMENTS

| | | | |
|---|---|---|---|
| 4,519,050 | 5/1985 | Folmsbee | 365/53 |
| 4,597,805 | 7/1986 | Mohan Rao | 257/544 |
| 4,656,626 | 4/1987 | Yudichak et al. | 365/49 |
| 5,045,913 | 9/1991 | Masleid et al. | 257/409 |
| 5,046,046 | 9/1991 | Sweha et al. | 365/49 |
| 5,070,378 | 12/1991 | Yamagata | 365/53 X |
| 5,192,993 | 3/1993 | Arai et al. | 257/652 |

OTHER PUBLICATIONS

Jerry Jex and Alan Baker, "Content Addressable Memory for Flash Redundancy," *IEEE Pacific Rim Conference on Communications, Computers, and Signal Processing*, May 9-10, 1991.

Primary Examiner—Eugene R. LaRoche
Assistant Examiner—Son Dinh
Attorney, Agent, or Firm—Blakely, Sokoloff, Taylor & Zafman

[57] ABSTRACT

A method is described for locating content addressable memory (CAM) bit cells on a column within a main memory array and within the guard ring surrounding the main memory array.

7 Claims, 3 Drawing Sheets

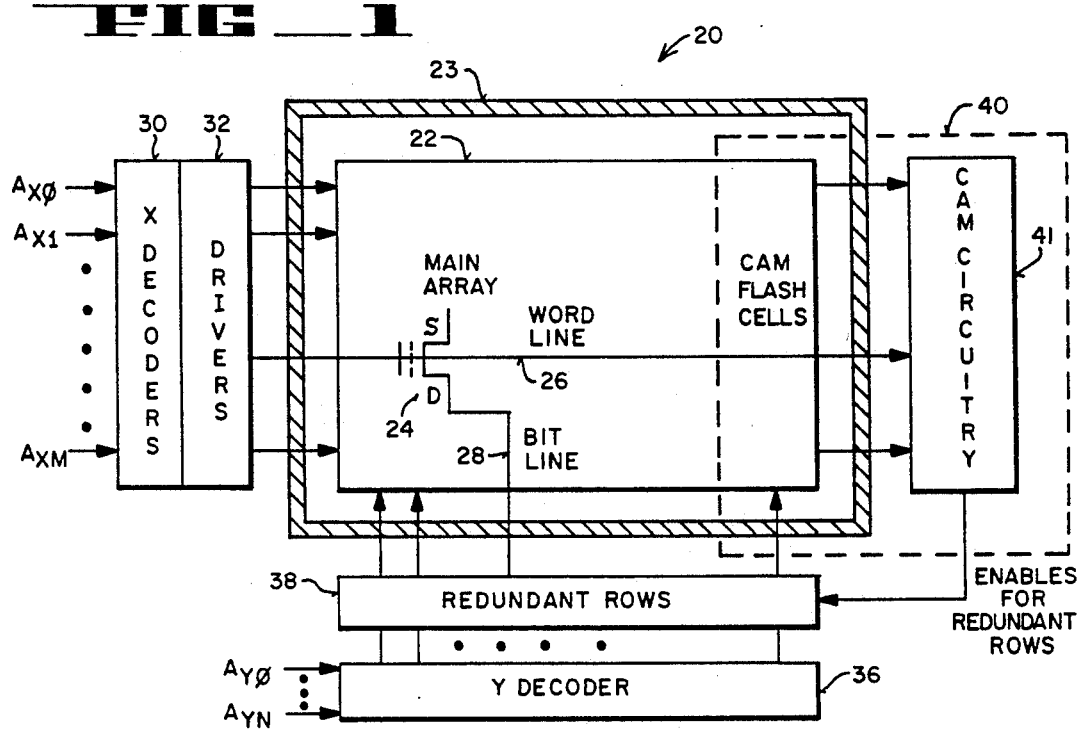
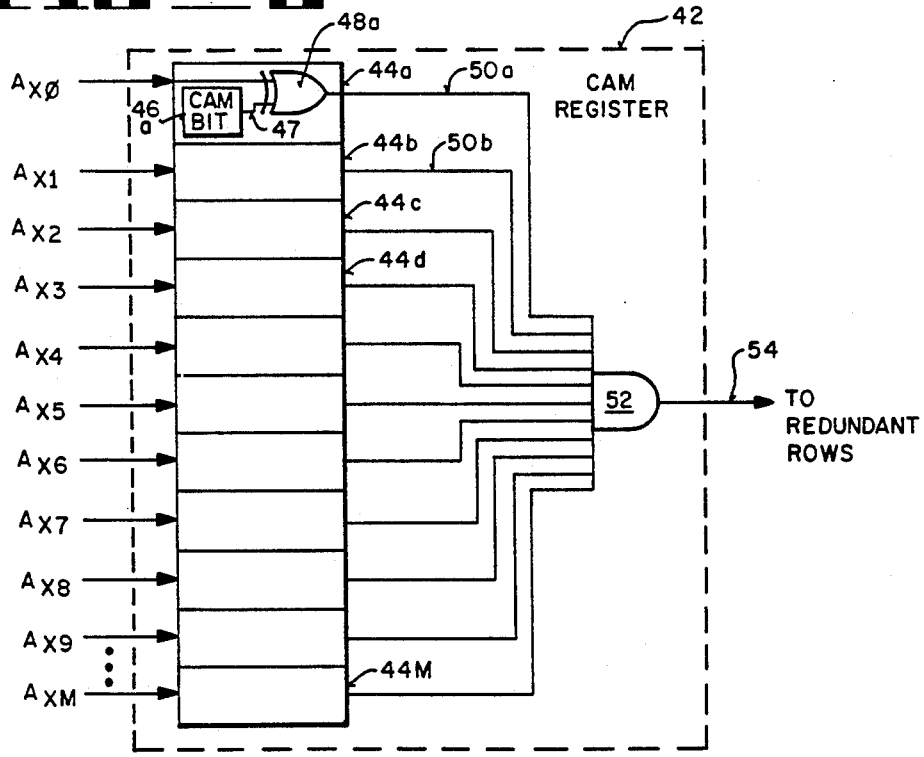

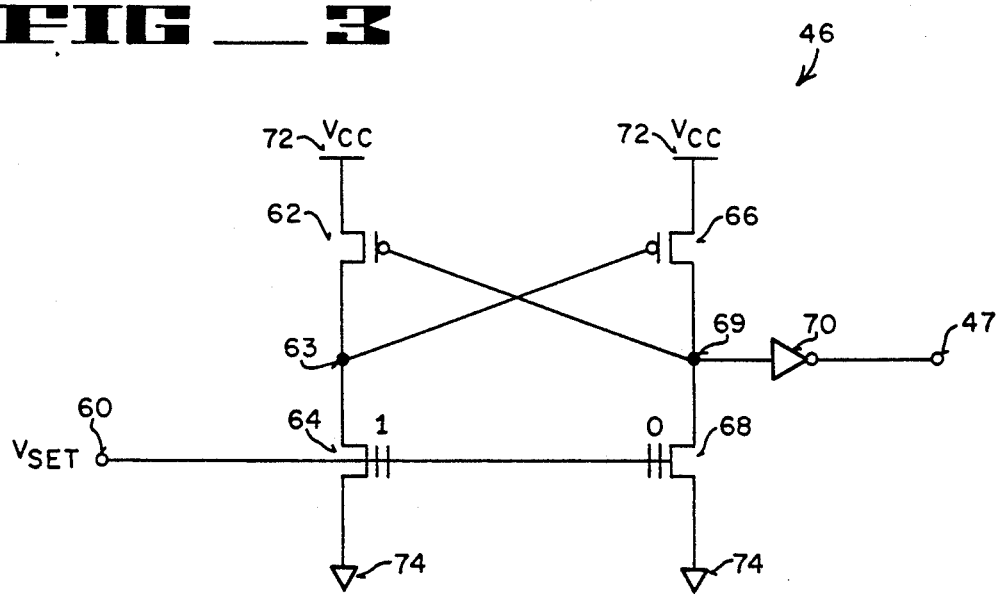
FIG_3

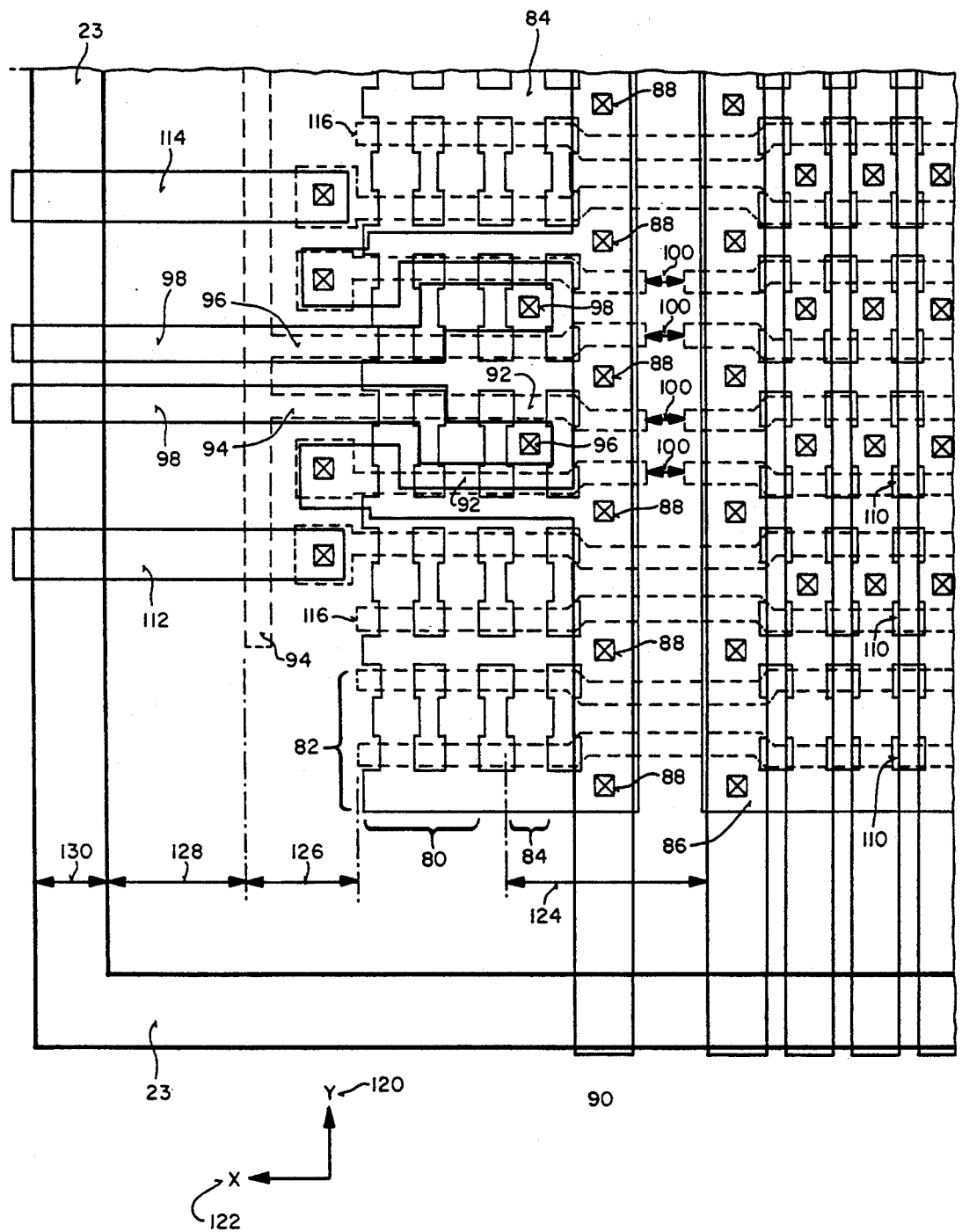
FIG_4

PHYSICAL PLACEMENT OF CONTENT ADDRESSABLE MEMORIES

FIELD OF THE INVENTION

The present invention relates to physical placement of content addressable memories (CAMs). More particularly, the present invention relates to the placement CAMs to reduce total die size and improve wafer yield.

BACKGROUND OF THE INVENTION

Semiconductor memory manufacturers use spare memory cells to repair defective memory cells and improve wafer yield. Spare memory cells are commonly called redundant memory cells. Thus, redundancy refers to schemes utilizing spare memory cells. Content addressable memories (CAMs) are a popular means of implementing redundancy. A CAM stores the address of an electrically defective memory element. The defective memory element is replaced with a redundant memory element when the CAM is activated.

Placement of CAMs on a die relative to a memory array varies. In one prior UV erasable electrically programmable read only memories (EPROMs) the CAMs are located to the side of the memory array. The CAMs may then be addressed by memory array row selects, thereby decreasing circuitry associated with CAMs. To prevent the CAMs from being erased along with the memory array, the CAMS are sealed to prevent UV light from reaching and erasing them. As a result, CAMs in UV EEPROMs are quite large. This is a disadvantage as large CAMs increase die size and decrease wafer yield.

In one prior electrically erasable programmable read only memory (EEPROM) CAMs are placed below the main memory array in separate mini-arrays. Due to their location the CAMs cannot be driven by main array wordline selects. The additional circuitry required to drive the CAMs increases die size.

The guard rings surrounding each CAM mini-array also increase the die size of the prior EEPROM. Guard rings surround the CAM mini-arrays to prevent electrons injected into the mini-arrays from straying into other circuits. Guard rings also attract certain impurities into the guard ring structure and away from the arrays which guard rings surround. Guard rings increase die size in disproportion to their actual size because lay-out design rules dictate that circuitry must be spaced apart from guard rings.

SUMMARY OF THE INVENTION

An object of the present invention is to decrease the die size impact of CAMs.

Another object of the present invention is to improve yield in semiconductor memories utilizing CAMS.

Described below is a method of locating content addressable memory (CAM) circuitry on a die to reduce total die size. CAM circuitry includes a number of CAM bits, each of which uses two flash memory cells. The flash memory cells forming the CAM bits are fabricated on a column within the main memory and surrounded by the main array guard ring. The remaining CAM circuitry is located adjacent to the main array so that it can be driven by array array word line selects, thereby eliminating driving circuitry for the CAMs.

Other objects, features, and advantages of the present invention will be apparent from the accompanying drawings and the detailed description that follows.

BRIEF DESCRIPTION OF THE FIGURES

The present invention is illustrated by way of example and not limitation in the figures of the accompanying drawings in which references indicate similar elements and in which:

FIG. 1 is as block diagram of a main memory array and CAM registers;

FIG. 2 is a block diagram of a CAM register;

FIG. 3 is a schematic of a CAM bit;

FIG. 4 is a top view of a portion of main memory.

DETAILED DESCRIPTION

FIG. 1 illustrates a flash main memory array and associated CAMs. As will be described in more detail below, the CAM flash cells are located adjacent to the main array and within the main memory array guard ring.

FIG. 1 illustrates a portion 20 of a flash memory that incorporates redundant memory rows. The CAMs of the present invention are used to identify defective rows within the main memory array and to activate the redundant memory rows. The CAMs of the present invention can also be used to replace defective columns within a main memory array in memories incorporating redundant columns.

Main memory array 22 includes a number of memory cells 24, also called floating gate transistors 24. Memory cells 24 are formed by the intersection of wordlines 26 and bit lines 28. Memory array 22 is surrounded by guard ring 23. Guard ring 23 prevents electrons injected into memory array 22 from straying out of array 22 and disturbing other circuits. Other circuits, such as CAM circuitry 41, respond to stray electrons with undesired CMOS latch-up. By surrounding main array 22 guard ring 23 separates array 22 from other circuits. Guard ring 23 offers the additional advantage of attracting certain impurities to itself and away from memory array 22.

Memory cells 24 are selected by activating associated wordliness 26 and bit lines 28. X decoder 30 controls the activation of wordliness 26. X decoder 30 decodes address signals $AX_0$, $AX_1$, ... $AX_m$ to determine the particular wordline selected. Drivers 32 activate the wordline selected by X decoder 30. Similarly, Y decoder 36 selects a byte, i.e. 8 bit lines 28, to be activated by decoding address signals $AY_0$, $AY_1$, ... $AY_n$. Drivers 32 activate the eight selected bit lines 28.

Redundant rows 38 replace defective rows of memory cells 24. Redundant rows 38 are selected by CAMs 40 and driven by drivers 32.

CAMs 40 are organized as four CAM registers 42, each storing the address of one defective row within memory array 22. Thus, in the preferred embodiment up to four defective rows can be replaced. The number of defective rows to be replaced is chosen by balancing the increase in yield resulting from redundancy versus the decrease in yield caused by increased die size.

Each CAM register 42 compares address signals $AX_0$, $AX_1$, ... $AX_m$ to the address that it stores. When a match occurs CAM register 42 activates one of the redundant rows 38.

FIG. 2 illustrates in block diagram form a CAM register 42. CAM register 42 performs its function using a number of comparators 44. Each comparator 44 compares one address bit, $AX_0, AX_1, \ldots,$ or $AX_m$, to the value stored by a CAM bit 46. Exclusive NOR gate XNOR 48 performs the comparison, outputting a logic 1 when the address bit and CAM bit 46 agree. The outputs 50 from each comparator 44 are ANDed together by AND gate 52. When each comparator 44 indicates a match, AND gate 52 brings its output active high, thereby activating its associated redundant row.

FIG. 3 shows a preferred embodiment of a CAM bit 46. CAM bit 46 includes four transistors 62, 64, 66, and 68 and inverter 70. Transistors 62 and 66 are both tied to 5 volt supply, $V_{cc}$ 72. Transistors 62 and 66 are cross coupled to each other. Transistors 64 and 68 are both nonvolatile, flash memory cells, also referred to as CAM flash cells 64 and 68. Transistor 64 is serially coupled between transistor 62 and ground 74. Transistor 68 is similarly coupled in series between transistors 66 and ground 74. $V_{set}$ 60 is coupled to the gates of both transistors 64 and 68. When power is applied to the flash memory $V_{set}$ is 5 volts. When the flash memory is not powered up, $V_{set}$ is 0 volts.

The logical state of CAM bit output 47 is controlled by CAM flash cells 64 and 68. CAM bit output 47 is set to a logic 1 by programming CAM flash cell 64 and erasing CAM flash cell 68. In other words, CAM bit output 47 is a logic 1 when CAM flash cell 64 stores a logic 0 and CAM flash 68 stores a logic 1. Analogously, CAM bit output 47 is a logic 0 when CAM flash cell 64 is erased (a logic 1) and CAM flash cell 68 is programmed (a logic 0).

Consider the operation of CAM bit 46 when CAM flash cell 64 stores a logic 0 and CAM flash cell 68 stores a logic 1. Transistor 64 is off, while transistor 68 conducts, pulling node 69 to ground 74. Inverter 74 responds to low input outputting a logic high as CAM bit output 47.

CAM bit 46 behaves in a symmetrical fashion when transistor 64 stores a logic 1 and transistor 68 stores a logic 0. Transistor 68 does not conduct, while transistor 64 does, pulling node 63 to ground. The low voltage level on the gate of transistor 66 causes it to conduct and pull node 69 to a high voltage, $V_{cc}$ 72. Inverter 70 responds by forcing CAM bit output 47 to a low voltage.

CAM registers 42 are not fabricated as separate mini-arrays. Instead, CAM flash cells 64 and 68 are fabricated as part of main memory array 22 and reside within guard ring 23. The remaining CAM register circuitry resides within CAM circuitry 41, located to the side of main memory array 22. Because CAM circuitry 41 does not inject electrons, no guard ring surrounds CAM circuitry 41. Thus, the total number of guard rings within portion 20 is reduced, thereby, directly reducing the die size required to implement redundancy using CAMs.

FIG. 4 is a top view of a corner of flash memory 20, illustrating the location of CAM flash cells 64 and 68 within main memory 22. Only a subset of the flash memory cells 24 within main memory array 22 are shown for simplicity's sake.

As is the custom, the two columns 80 and two rows 82 at the edge of array 22 are not used. For this reason they are referred to as dummy rows 82 and dummy columns 80.

CAM flash cells reside on a single column 84, juxtaposed between dummy columns 80 and main array columns 86. The sources 88 on column 84 are all tied to ground by source strap 90. The gates 92 of CAM flash cells are all tied together by gate strap 94. Gate strap 94 is in turn coupled to $V_{set}$ 60. The drains 96 of CAM flash cells are coupled to CAM circuitry 41 via drain straps 98.

The gate straps 94 of CAM flash cells are separated by a distance X 100 from the gate straps 110 of main array 22. The separation between gate straps 94 and 110 is necessitated by the difference in voltage levels coupled to main array flash cells 24 and CAM flash cells. The minimum separation between gate straps 94 and 110 is defined by lithographic process used to fabricate main array 22. The voltage on CAM flash cell gates is set by $V_{set}$ 60, while the gates of main array flash cells 24 are varied according to whether memory cells 24 are being read, programmed, or erased. The break in the polysilicon forming gate straps 94 and 110 is unusual and introduces a series of irregularities in generally uniform array 22.

Driving CAM circuitry 41 via drivers 32 introduces further irregularities into array 22. Wordlines 112 and 114 must exit array 22 to reach CAM circuitry 41. This prevents the fabrication of a CAM flash cell in those rows of CAM column 80 from which wordlines 112 and 114 exit. CAM flash cells 64 and 68 could be separated from wordlines 112 and 114 by dummy rows 116 the resulting pitch were tolerable. As a precaution, the gates of dummy rows 116 are grounded. A pair of dummy rows 116 sandwich a pair a CAM flash cells 64 and 68 and wordlines 112 and 114, separating them from other CAM flash cells.

Wordlines 112 and 114 and dummy rows 116 and directly impact the pitch of CAM flash cells. Pitch refers to the number of main array rows per CAM bit. In the Y-direction 120 the pitch is 8. In other words, for every eight array rows one CAM bit, including two CAM flash cells, is fabricated. In alternative embodiments, the pitch is reduced to 6 by eliminating dummy rows 116. The small pitch of CAM bits allows them to be fabricated as part of the typical array fabrication process called array step and repeat (ASR). Using ASR, an array of the desired size is created by repeating the lay-out cell.

The placement of CAM flash cells within main array 22 only marginally increase the size of main array 22. In the Y-direction 120 CAM flash cells do not increase the size of main array 22 at all. The increase in size in the X-direction 122 includes the distance from the edge of gate straps 110 to the far edge of CAM column 84, distance 124, and the distance from dummy columns 80 to the far edge of gate strap 94, distance 126. Dummy columns 80 and guard ring 23 are not part of the cost of inserting CAM column 84 because they would have been part of main array 22 in any case. While increasing the total size of main array 22, inserting CAM column 84 within main array 22 decreases the total die size. CAM column 80 no longer requires a separate guard ring, thus decreasing die size by twice the width of a guard ring, distance 130, and twice the spacing between a guard ring and any polysilicon, distance 128.

Thus, a method of locating content addressable memories (CAMs) to reduce die size and improve wafer yield has been described. According to the present method, CAM flash cells are located on a column adjacent to main memory array column and within the main array guard ring.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A content addressable memory (CAM) bit associated with a flash memory array having a guard ring, the CAM bit comprising:

a flash memory cell located on a column fabricated as part of the flash memory array and within the guard ring.

2. The content addressable memory of claim 1 wherein a vertical pitch of the CAM bit relative to the flash memory array is within a range of 6 to 8.

3. The content addressable memory of claim 2 wherein the flash memory cell is included within the array step and repeat size.

4. The content addressable memory of claim 1 wherein:

a) the column has a first multiplicity of gate straps at a first voltage level and the flash array has a second multiplicity of gate straps at a second voltage level, the first multiplicity of gate straps being located a minimum separation distance away from the second multiplicity of gate straps, the minimum separation distance being defined by the lithographic process used to fabricate the first multiplicity and the second multiplicity of gate straps.

5. A nonvolatile semiconductor memory comprising:
a) a main memory array having a multiplicity of memory cells;
b) a guard ring enclosing the main memory array;
c) a redundant memory cell for replacing a defective memory cell within the main memory array; and
d) a content addressable memory for activating the redundant memory cell, the content addressable memory including a CAM memory cell located on a column of the main memory array and within the guard ring, wherein a vertical pitch of the CAM cell relative to the main memory array is within a range of 6–8.

6. The content addressable memory of claim 5 wherein the CAM memory cell is included within the array step and repeat size.

7. The content addressable memory of claim 5 wherein:

a) the column has a first multiplicity of gate straps at a first voltage level and the flash array has a second multiplicity of gate straps at a second voltage level, the first multiplicity of gate straps being located a minimum separation distance away from the second multiplicity of gate straps, the minimum separation distance being defined by the lithographic process used to fabricate the first multiplicity and the second multiplicity of gate straps.

* * * * *

UNITED STATES PATENT AND TRADEMARK OFFICE
CERTIFICATE OF CORRECTION

PATENT NO.   : 5,311,462
DATED        : May 10, 1994
INVENTOR(S)  : Steven Wells It is certified that error appears in the above-indentified patent and that said Letters Patent is hereby corrected as shown below:

Column 1, line 67, Delete "array"
      Column 4, line 31, After "116" Delete "and"

Signed and Sealed this

Nineteenth Day of September, 1995

Attest:

BRUCE LEHMAN

*Attesting Officer*    *Commissioner of Patents and Trademarks*